US006584670B2

(12) United States Patent
Costa

(10) Patent No.: US 6,584,670 B2
(45) Date of Patent: Jul. 1, 2003

(54) ELECTRICAL TERMINAL IMPLEMENTATION DEVICE

(76) Inventor: Larry J. Costa, 54201 Ash Rd., Osceola, IN (US) 46561

(*) Notice: Subject to any disclaimer, the term of this patent is extended or adjusted under 35 U.S.C. 154(b) by 74 days.

(21) Appl. No.: 09/859,075

(22) Filed: May 16, 2001

(65) Prior Publication Data

US 2001/0039726 A1 Nov. 15, 2001

Related U.S. Application Data

(63) Continuation-in-part of application No. 09/510,281, filed on Feb. 21, 2000, now Pat. No. 6,438,818.

(51) Int. Cl.[7] .......................... H05K 3/34; B23P 23/04; B23Q 41/00

(52) U.S. Cl. ...................... 29/564.7; 29/33 M; 29/741; 29/759; 29/843; 29/842; 29/844; 29/874; 29/876; 29/566.2; 901/41; 901/42; 228/49.5; 228/103; 228/44.7

(58) Field of Search ............................ 29/564.7, 564.6, 29/566.2, 566.3, 33 M, 741, 839, 840, 843, 739, 759, 705, 842, 844, 874, 876, 877, 878, 879, 747; 228/33, 44.7, 49.5, 248.1, 207, 223, 212, 213, 180.21, 205, 103, 104; 901/41, 42

(56) References Cited

U.S. PATENT DOCUMENTS

| | | | | | |
|---|---|---|---|---|---|
| 3,739,446 | A | | 6/1973 | Long, Jr. et al. | |
| 4,003,125 | A | | 1/1977 | Wallick | |
| 4,152,172 | A | * | 5/1979 | Jensen et al. | 228/205 |
| 4,214,120 | A | | 7/1980 | Jones, Jr. et al. | |
| 4,286,380 | A | * | 9/1981 | Blount | 29/741 |
| 4,429,559 | A | | 2/1984 | dePuglia et al. | |
| 4,503,609 | A | | 3/1985 | Mackay | |
| 4,578,736 | A | | 3/1986 | Brown | |
| 4,602,429 | A | | 7/1986 | Nicoll | |
| 4,672,742 | A | * | 6/1987 | Juan | 29/840 |
| 4,740,133 | A | * | 4/1988 | Kawano | 901/42 |
| 4,794,689 | A | * | 1/1989 | Seno et al. | 29/705 |
| 4,796,357 | A | * | 1/1989 | Smith | 29/840 |
| 4,980,971 | A | * | 1/1991 | Bartschat et al. | 29/759 |
| 5,038,466 | A | * | 8/1991 | Marozsan et al. | 29/840 |
| 5,579,574 | A | | 12/1996 | Colleran et al. | |
| 5,714,252 | A | * | 2/1998 | Hogerton et al. | 29/832 |
| 5,730,608 | A | | 3/1998 | Legrady | |
| 5,898,983 | A | * | 5/1999 | Sooy et al. | 29/33 M |
| 6,113,248 | A | | 9/2000 | Mistopoulos et al. | |
| 6,196,439 | B1 | * | 3/2001 | Mays et al. | 228/6.2 |
| 6,438,818 | B1 | * | 8/2002 | Costa | 228/49.5 |

OTHER PUBLICATIONS

Metals Handbook, 2nd ed., 1998, 1123–1134.

* cited by examiner

*Primary Examiner*—A. L. Wellington
*Assistant Examiner*—Erica E Cadugan
(74) *Attorney, Agent, or Firm*—Thomte, Mazour & Niebergall; Shane M. Niebergall

(57) ABSTRACT

The present invention relates to a workpiece implementation device that fabricates individual workpieces, positions them at their point of use on a component, and connects the workpieces to the components. The device further comprises an accessory assembly capable of shaping the workpieces, coating the workpieces with a solderable material, burnishing the point of use on the component, and testing the connection between the workpieces and the component. The positioning, attaching, and accessory assemblies of the workpiece implementation device are adapted to selectively perform their individual functions without the necessity of first repositioning the component or the implementation device. Accordingly, the present invention increases overall production efficiency by integrating several separate implementation tools and workstations into a single, adaptable device.

13 Claims, 18 Drawing Sheets

ELECTRICAL TERMINAL IMPLEMENTATION DEVICE

CROSS-REFERENCE TO RELATED APPLICATION

This is a continuation-in-part application of Petitioner's earlier U.S. application Ser. No. 09/510,281 now U.S. Pat. No. 6,438,818 filed Feb. 21, 2000, entitled ELECTRICAL TERMINAL IMPLEMENTATION DEVICE.

BACKGROUND OF THE INVENTION

1. Field of the Invention

This invention relates to a device that fabricates, positions, and installs electrical terminals and hardware attachments to subject components. The device of the present invention is further capable of accomplishing optional functions, such as burnishing and electrical/mechanical-pull testing, without repositioning the device for each such optional function.

2. Description of the Prior Art

Electrical terminals must be connected to certain articles of manufacture to allow for the flow of electricity from one medium to a different medium. This is particularly true in instances where the conductive elements are embedded in or disposed on a non-conductive material, such as a silica substrate. For example, electrical terminals must be attached to glass automotive windows having embedded wire or silver oxide painted defrost grids to provide a point of input and output for electrical current.

Currently, such terminals are manufactured beginning with the step of obtaining a ribbon of copper, then cleaning, tin-plating, and reeling the ribbon. The ribbon is de-reeled, clad with a solder material on one side, and re-reeled. The ribbon of solder-clad copper is fed into a progressive stamping die that blanks out the flat terminal, then forms the terminal into its final shape. The terminals are connected to a carrier strip that is used to transfer the terminals along the multiple stations of the progressive stamping die. The progressive stamping die cuts the individual terminal off of the carrier strip at its last station. The individual terminals are optionally cleaned and tin-plated to cover the exposed copper where it was cut from the carrier strip. The individual terminals are fed by a vibratory bowl feeder into a machine that applies a flux coating to the solder-clad base of the terminal. The individual terminals are shipped loosely in a container to the fabricator.

At the fabricator, the individual terminals are attached to the subject component, usually by either manual soldering or automated soldering. In manual soldering, the individual terminals are picked at random from the container by the operator and soldered to the appropriate component. In automated soldering, the individual terminals are fed into a vibratory bowl feeder where they are oriented, fed at random into a track, and positioned in a locating fixture from which a robot withdraws the individual terminal. The robot then moves the terminal to the component and positions it to be soldered.

Although this process of production and implementation of electrical terminals is well established, it has several shortcomings that cause defects and unnecessary expense. One shortcoming of the established process is the cost of flux-coating individual terminals. The vibratory bowl feeders into which the individual terminals are loaded are frequently jammed and otherwise prevented from operating properly because the terminals become tangled. Another shortcoming of the established process is the loose packaging of the individual terminals, which causes the flux coating to be damaged. This damage can occur in shipping or in the bowl feeder used to orient the terminals in automated soldering. The damage to the flux coating reduces the ability of the terminal to adhere to the component when it is soldered. A further shortcoming of the established process is that manufacturing lot traceability is not accurate. Terminals placed in vibratory bowl feeders are moved randomly. An individual terminal that is moved through the feeder will have spent an indeterminate amount of time in the feeder. The longer a terminal spends in the vibratory bowl feeder, the more likely it is to have some or all of its flux coating removed. The problem of flux coating damage is made more difficult to identify if clear flux is used rather than colored flux. Yet another shortcoming of the established process is the expense associated with automated soldering. Separate pieces of machinery are required to orient the terminals and transfer the terminal from the locating fixture to the soldering location. A further shortcoming of the established process is the time and expense required to clean and tin plate the copper ribbon a second time to cover the copper exposed when the individual terminals are cut.

Accordingly, there is a need for an improved method and device for positioning, and installing electrical terminals and to subject components.

SUMMARY OF THE INVENTION

The present invention relates to a workpiece implementation device that fabricates individual terminals, positions the terminals at their point of use, and connects the terminals to the subject components. The present device may also include an apparatus for shaping the terminal, coating the terminal with flux, burnishing the component, attaching a terminal to the component, and testing the connection between the terminal and the component.

More specifically, the device of present invention efficiently performs the functions of several separate devices. Integrated terminals are fed into the device by a terminal feeder. A selector assembly then directs the integrated terminals from the feeder toward a punch. However, before the punch separates an individual terminal from the integrated terminals, a loader assembly grips the individual terminal. The individual terminal then separated from the integrated terminals and is moved by the loader assembly to a positioner assembly. An optional burnishing tool then burnishes the point of use on the component prior to the application of the terminal. The positioner assembly moves the individual terminal to the point of use on the subject component and the terminal is connected to the component. Finally, a terminal postponer tests the mechanical connection between the terminal and the component and an electrical testing mechanism tests the electrical characteristics of the component.

It is therefore an object of the invention to provide a device which separates integrated electrical terminals and positions the terminals at a point of use.

A further object of the invention is to provide a device which selects individual electrical terminals from integrated electrical terminals and implements them without subjecting the individual terminals to bulk storage or shipping.

A further object of the invention is to provide a device which prevents damage to the flux coating applied to soldered terminals.

A further object of the invention is to provide a workpiece attachment device that performs electrical testing and mechanical pull testing without the necessity of repositioning the device.

A further object of the invention is to provide a workpiece attachment device that allows the electrical testing function to be started while the solder connection solidifies.

A further object of the invention is to burnish the point of use on the component prior to connecting a terminal thereto without the necessity of repositioning the device.

A further object of the invention is to provide a device that allows for the implementation of workpieces and the tracing of production lots.

These and other objects of the invention will be apparent to those skilled in the art.

DESCRIPTION OF THE PREFERRED EMBODIMENT

The numeral 10 refers generally to the workpiece implementation device of the present invention. It should be understood that the present invention is well-suited for the implementation of various types of workpieces including, but not limited to, electrical terminals and hardware attachments (such as mounting points for automobile wipers, rear view mirrors, and window elevators). However, for simplicity of description, the present invention will be described as it is used to implement electrical terminals.

Figure 1A:
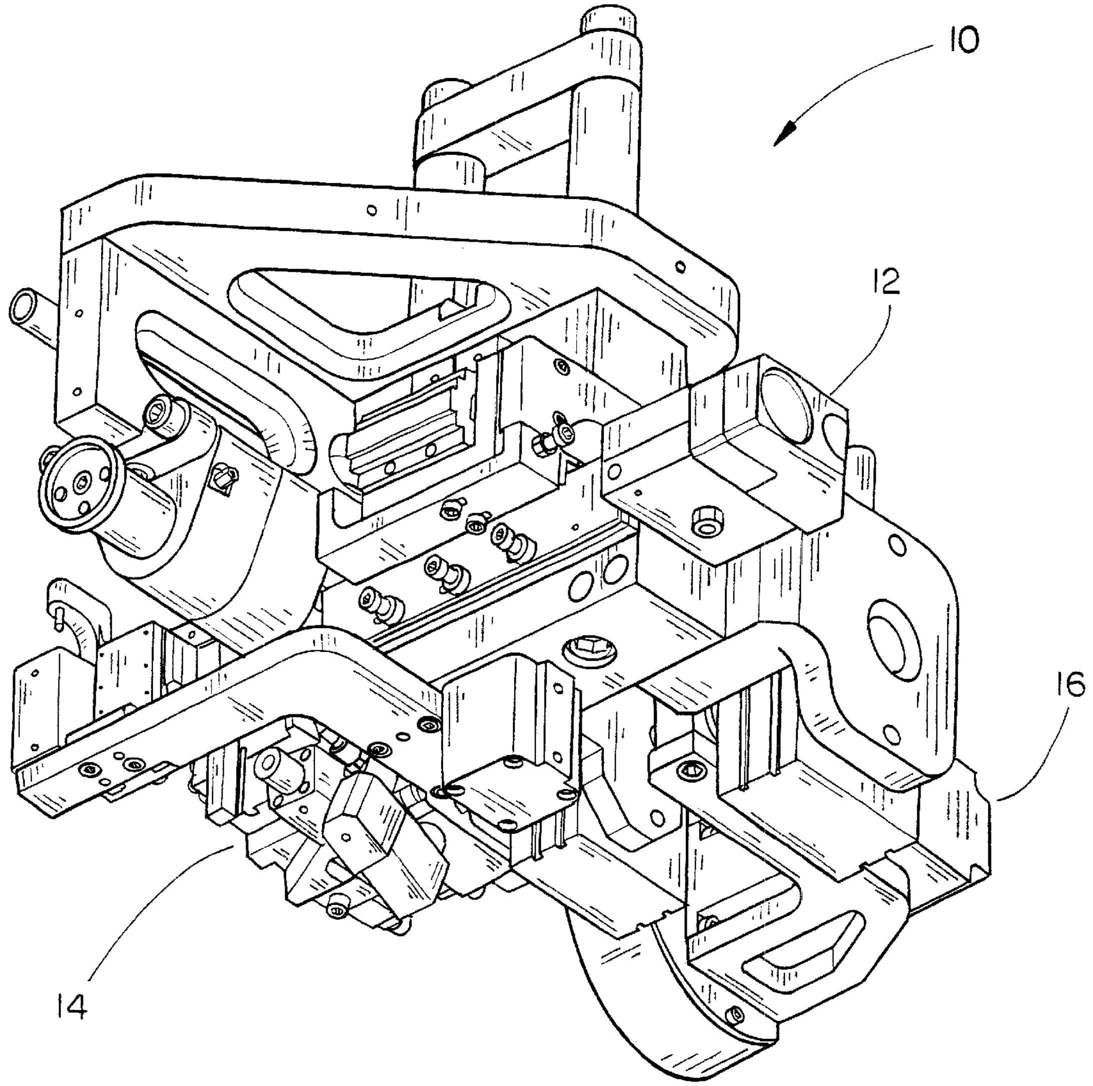
FIG. 1A is an isometric view of the underside of the device, with the burnish tool and workpiece application and test tool in their "up" position.
Figure 1B:
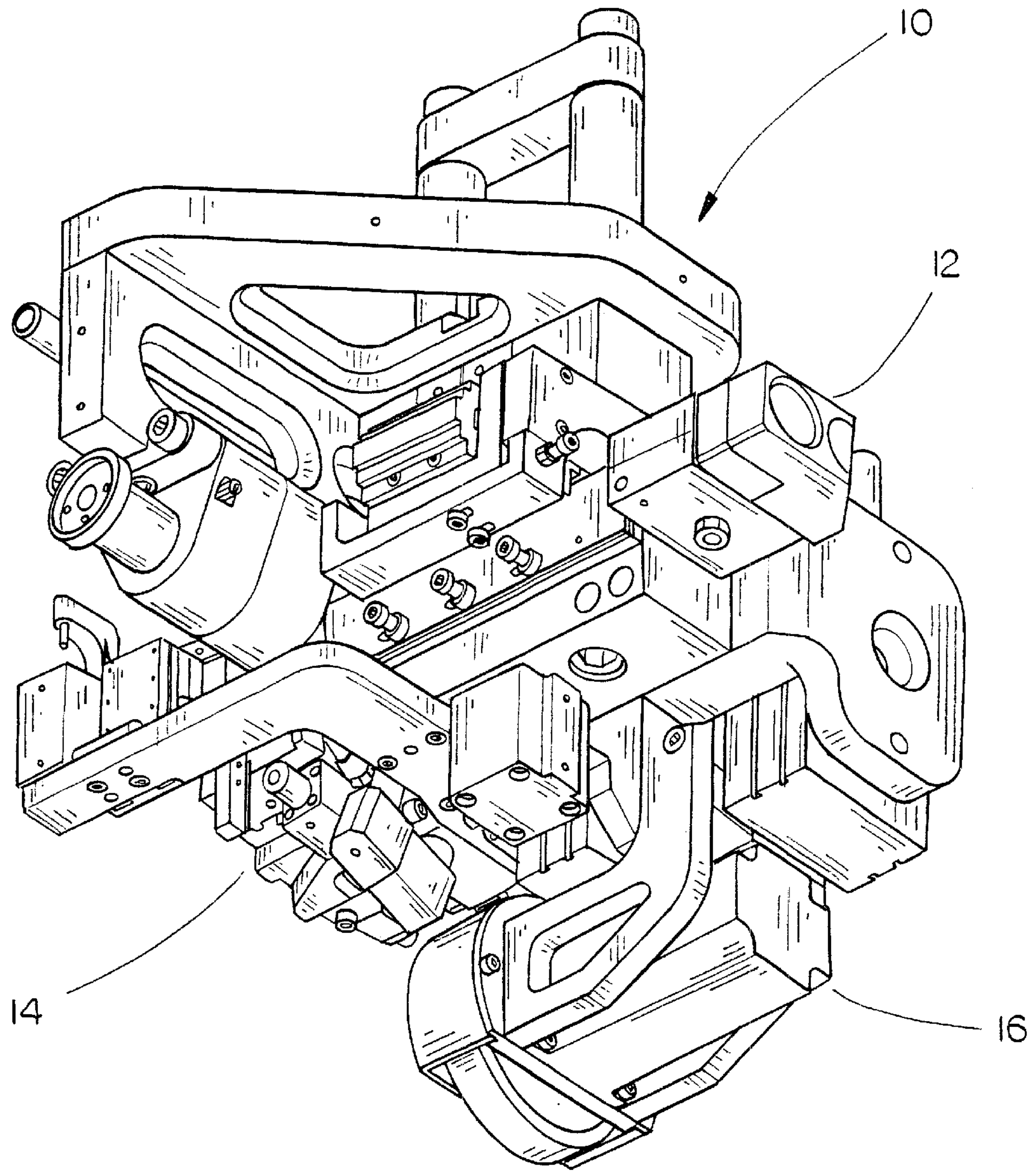
FIG. 1B is an isometric view of the underside of the device, with the burnish tool in its "down" position and the workpiece application and test tool in its "up" position.
Figure 1C:
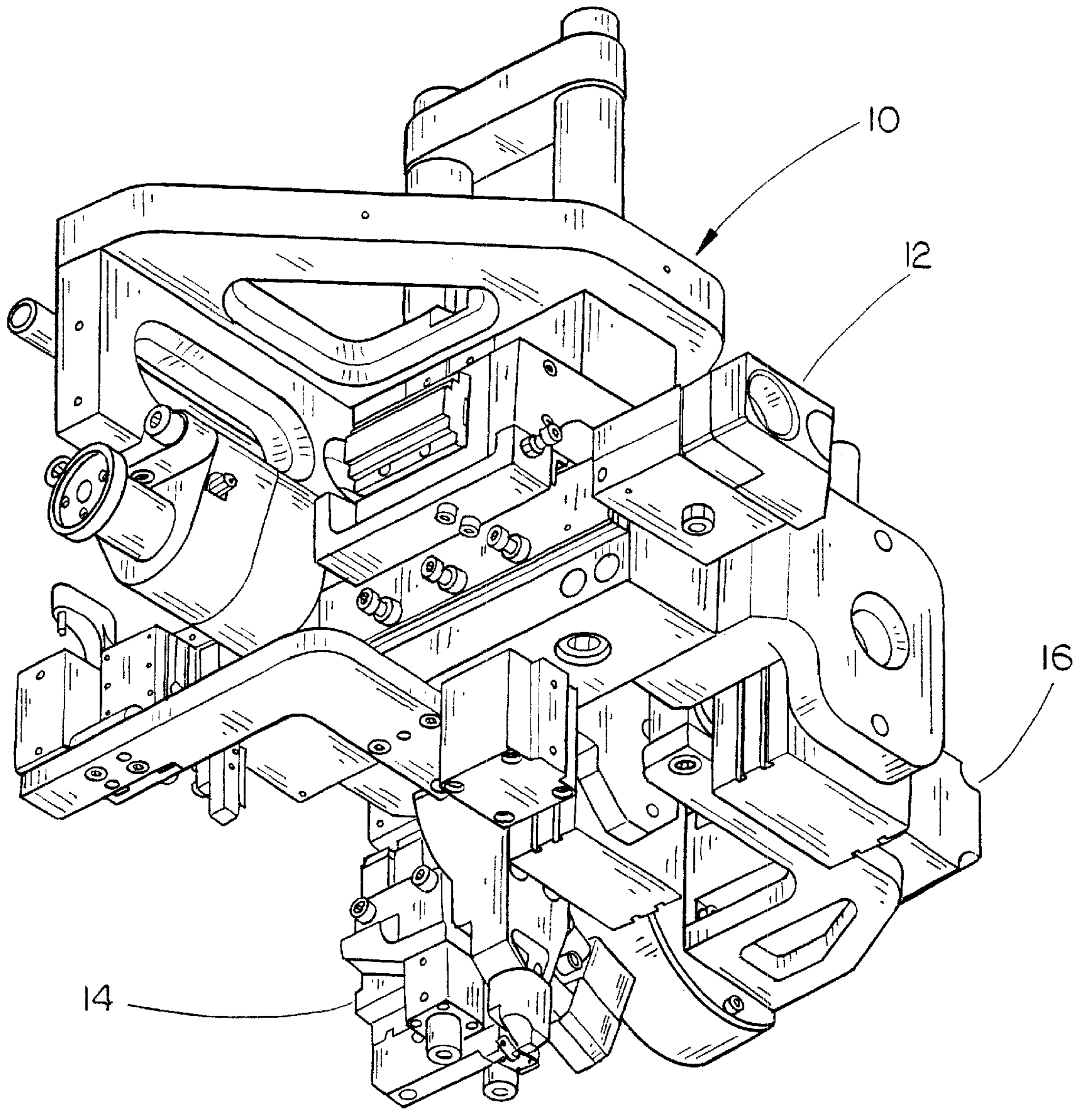
FIG. 1C is an isometric view of the underside of the device, with the burnish tool in its "up" position and the workpiece application and test tool in its "down" position.
Figure 2:
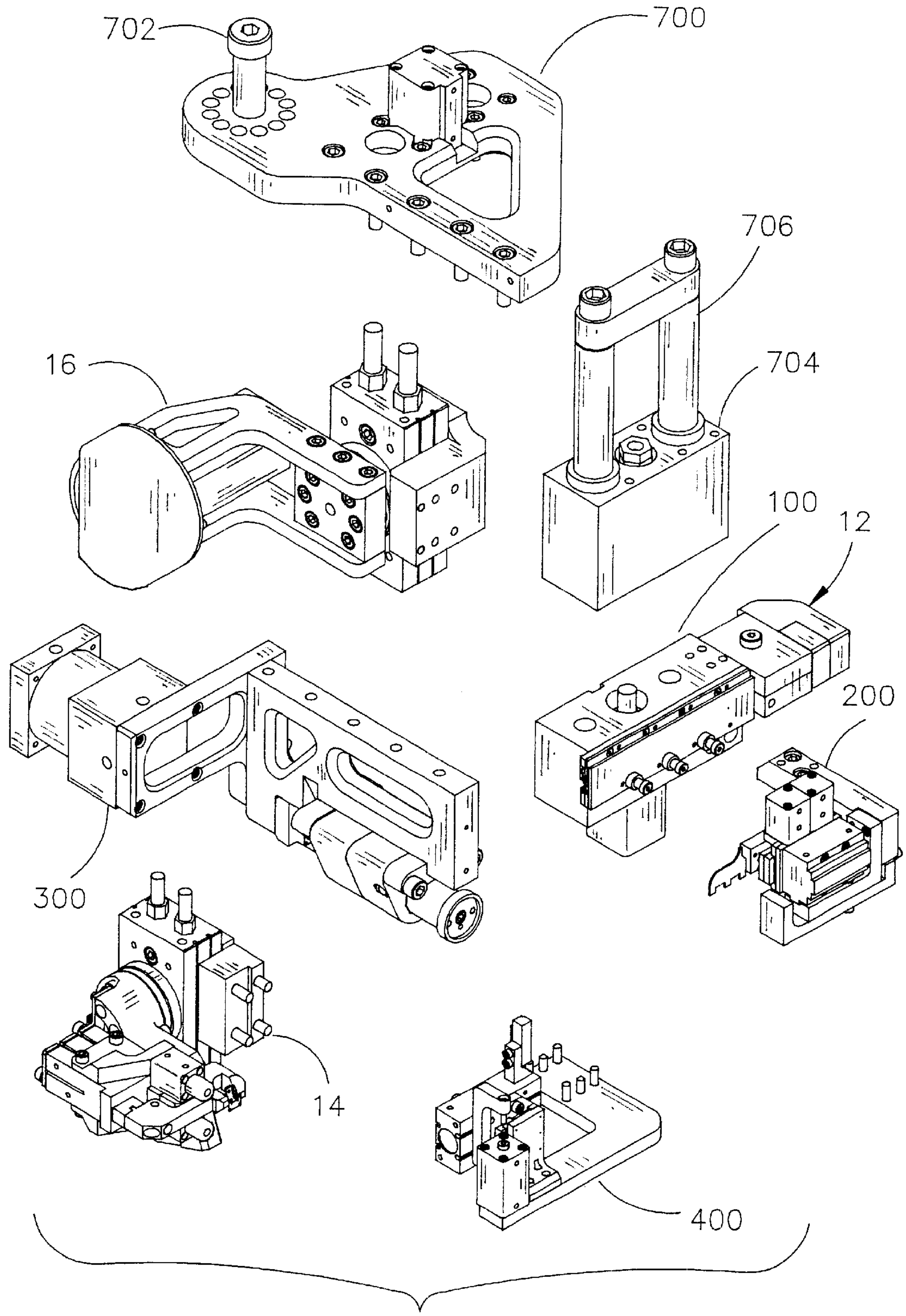
FIG. 2 is an exploded view of the assemblies of the device.
Figure 3:
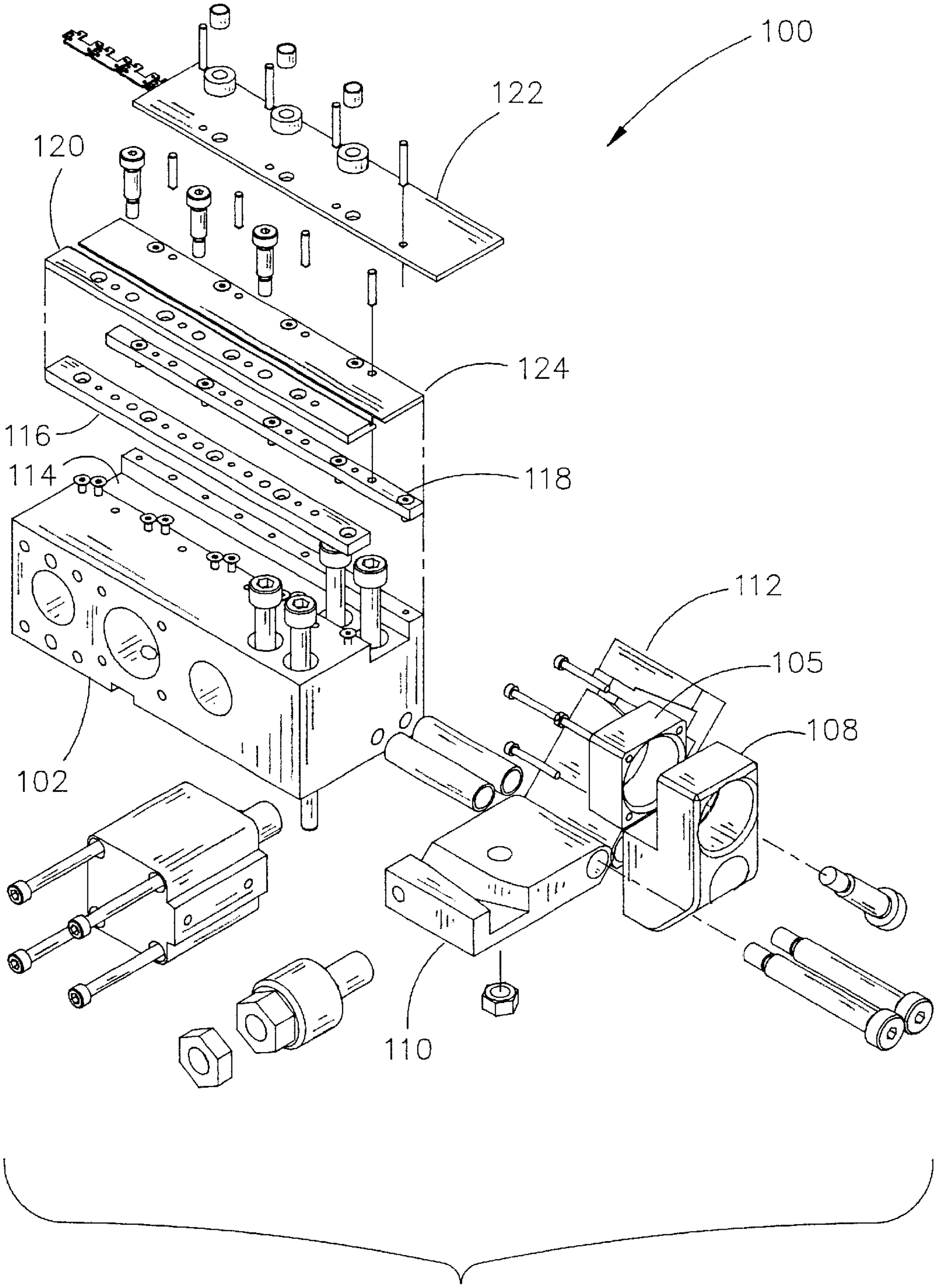
FIG. 3 is an exploded view of the infeed assembly.

As shown in FIGS. 1A, 1B, and 1C, the device 10 includes a feeder assembly 12, a soldering assembly 14, and a burnish assembly 16, each comprising constituent assemblies. FIG. 2 depicts the feeder assembly 12, which includes an infeed assembly 100, a selector assembly 200, a press assembly 300, and a loader assembly 400. The infeed assembly 100 includes an infeed mount 102. As shown in FIG. 3, the infeed mount 102 has attached to one side thereof a feed tube assembly. The feed tube assembly is comprised of feed tube collet 106, feed tube retainer 108, and left and right feed guides 110 and 112. The feed tube assembly directs the integrated electrical terminals 18 through the feed tube collet 106, feed tube retainer 108, and left and right feed guides 110 and 112 into the device 10. The integrated electrical terminals 18 are directed down a groove 114 in the infeed mount 102. The infeed mount 102 has attached to it on either side of groove 114 a heel spacer 116 and a blade spacer 118. The heel spacer 116 supports a heel plate 120, which supports infeed cover 122. The blade spacer 118 supports a blade plate 124. As can be seen in the drawings, the infeed cover 122 extends over the blade plate 124. As is also evident from the drawings, the blade plate 124 is thinner than the heel plate 120 resulting in a gap 126 between the infeed cover 122 and the blade plate 124.

The infeed assembly may also include a conventional shaping device for forming the integrated terminals 18. Such a device (not shown) may be used to form three-dimensional terminals from a flat piece of material. The use of flat integrated terminals would allow for the reduced cost of fabrication and shipping of the terminals. Similarly, three-dimensional terminals may be formed from partially formed integrated terminals. As is known in the art, it is common for electric terminals to have ribs, channels, or the like stamped into the terminals during fabrication. Final shaping of the partially formed terminals may be completed by the conventional shaping device.

Figure 4:
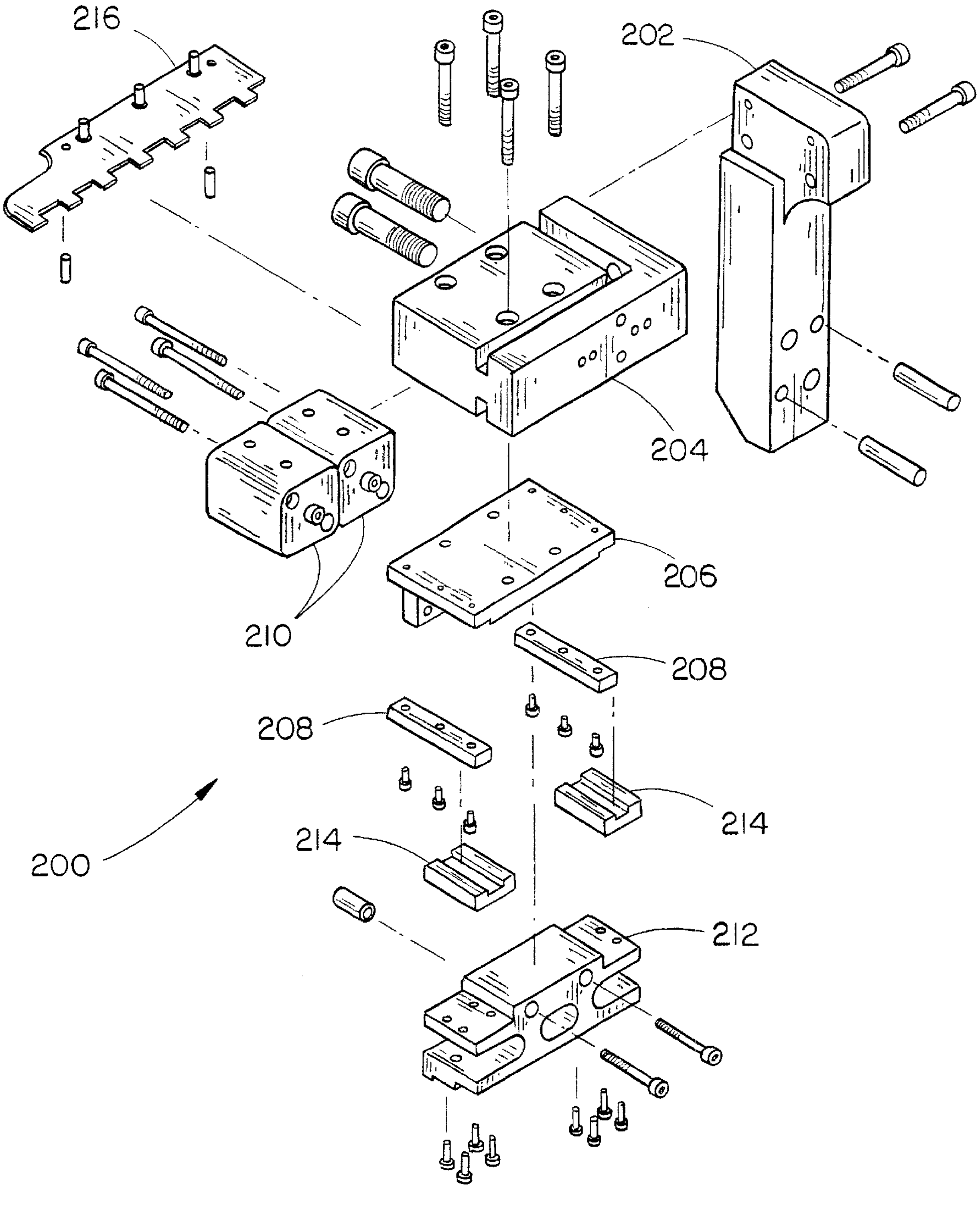
FIG. 4 is an exploded view of the selector assembly.

The integrated electrical terminals 18 are moved through the infeed assembly 100 by the selector assembly 200 which is shown in FIG. 4. The selector assembly 200 includes a selector mount 202, which is attached to the infeed mount 102. An air cylinder linear actuator 204 is mounted on the selector mount 202 and supports a bracket 206 that may be moved toward and away from the selector mount 202. The bracket 206 has mounted to it bearing rails 208 and indexing air cylinders 210. The indexing air cylinders 210 are connected to finger bracket 212, which supports bearing blocks 214 and feed finger 216. The bearing blocks 214 are adapted to slidably engage the bearing rails 208 on the bracket 206. The feed finger 216 is designed with a blade portion 218 that is adapted to fit into the gap 126 of the infeed assembly 100 and engage the integrated electrical terminals 18 therein.

Figure 5:
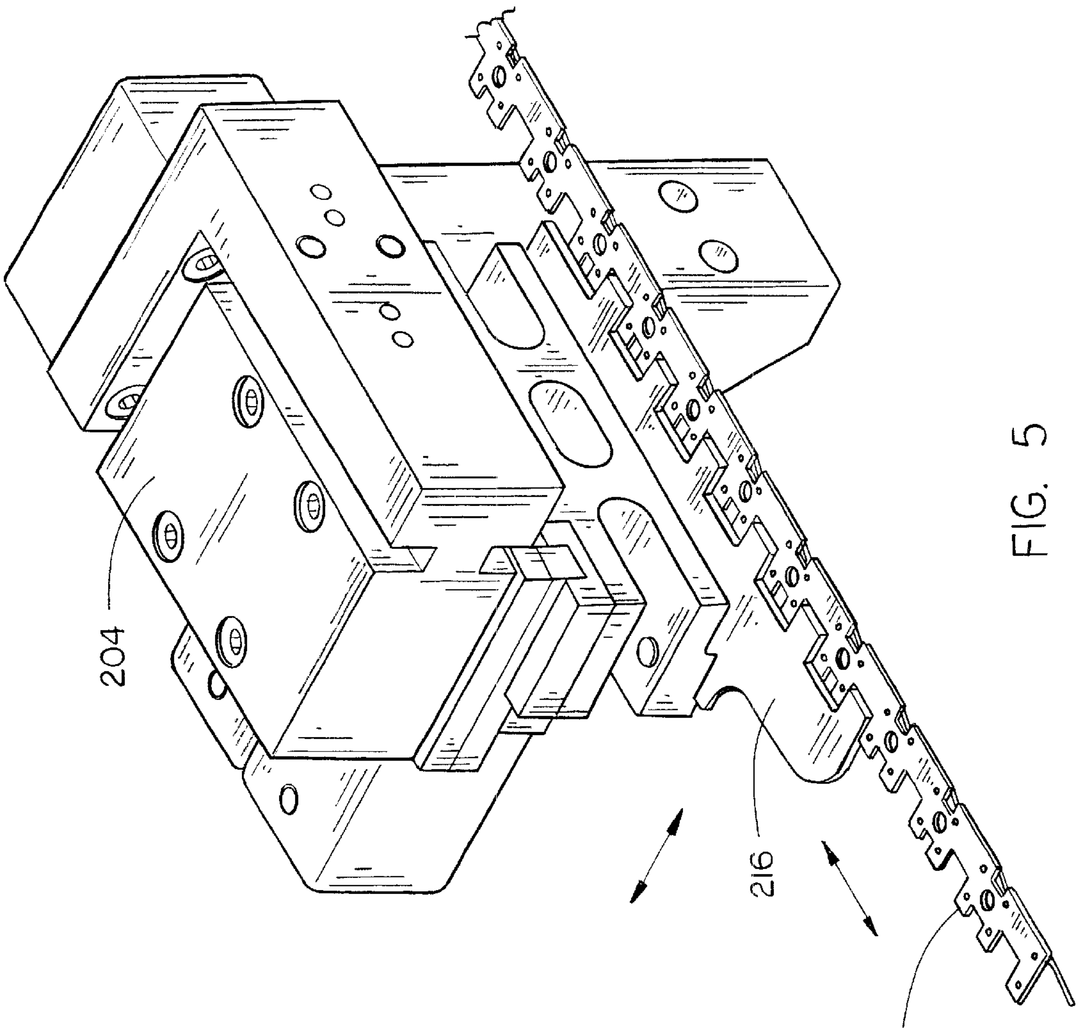
FIG. 5 is isometric view of the selector assembly in engagement with integrated workpieces.

The selector assembly 200 works in the following manner. The indexing air cylinders 210 are adapted to move the finger bracket 212 on the bearing rails 208 toward and away from the infeed assembly 100, as shown in FIG. 5. At the start of a cycle, the linear actuator 204 will have drawn the bracket 206 toward the selector mount 202. The indexing air cylinders 210 will have drawn the feed finger 216 away from the infeed assembly 100. The indexing air cylinders 210 will then move the feed finger 216 toward the infeed assembly 100 so that the blade portion 218 will engage the integrated electrical terminals 18 therein. The linear actuator 204 will then move the bracket 206 and, by necessity, the feed finger 216 away from the selector mount 202. This action will move the integrated electrical terminals 18 along the groove

114 in the infeed mount 102. Preferably, the integrated electrical terminals are composed of uniform individual terminals 20 connected by terminal carrier portions 22. The feed finger 216 will, preferably, move the integrated electrical terminals 18 along the groove 114 precisely a distance equivalent to the width of an individual terminal 20 and a terminal carrier portion 22. The indexing air cylinders 210 will then move the feed finger 216 away from the infeed assembly 100 and disengage the feed finger 216 from the integrated electrical terminals 18. The linear actuator 204 will then draw the bracket 206 and the feed finger 216 toward the selector mount 202 to the point of origin. The cycle may then be repeated to continue the movement of the integrated electrical terminals 18 through the device 10.

Figure 6:
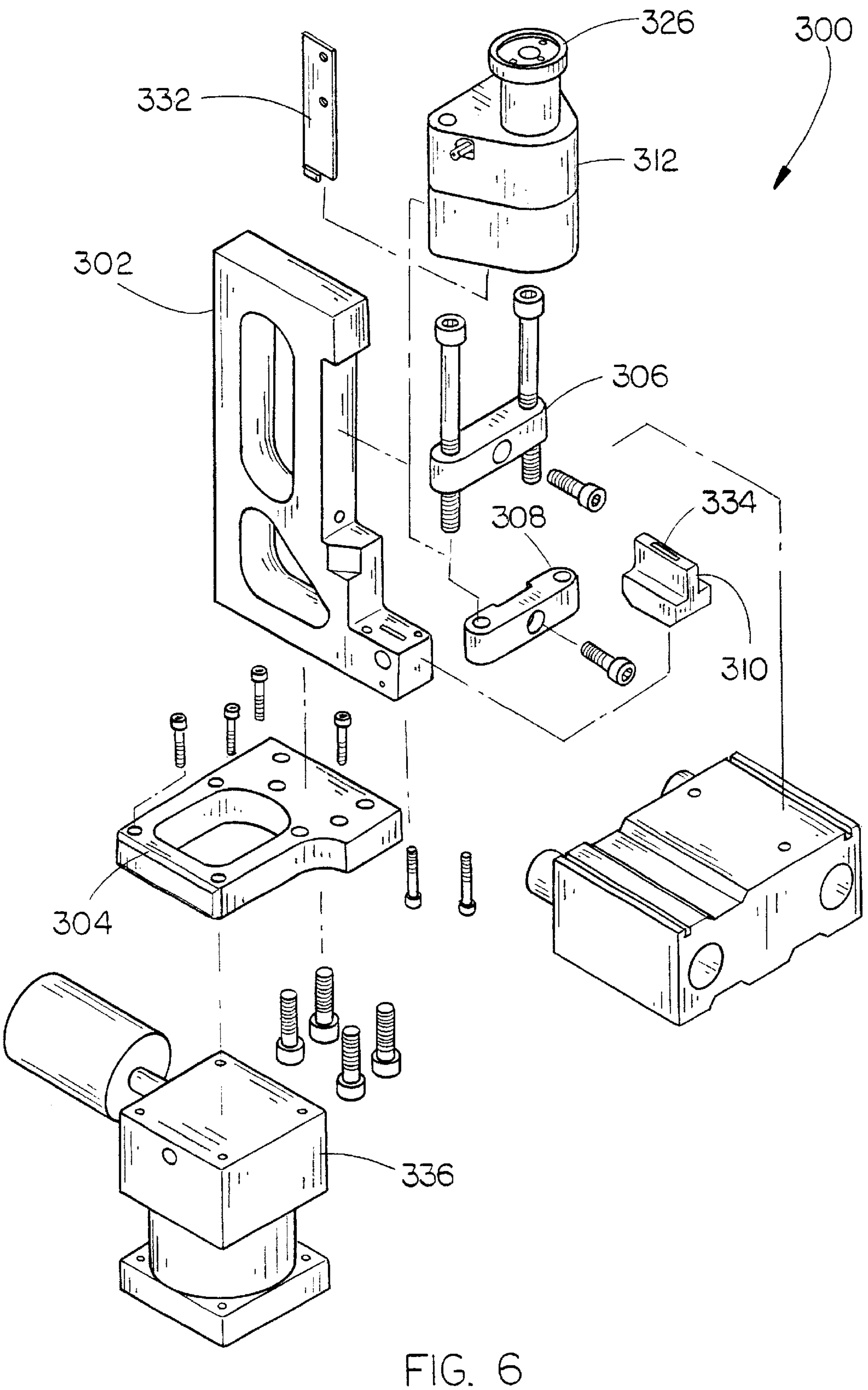
FIG. 6 is an exploded view of the press assembly.
Figure 7:
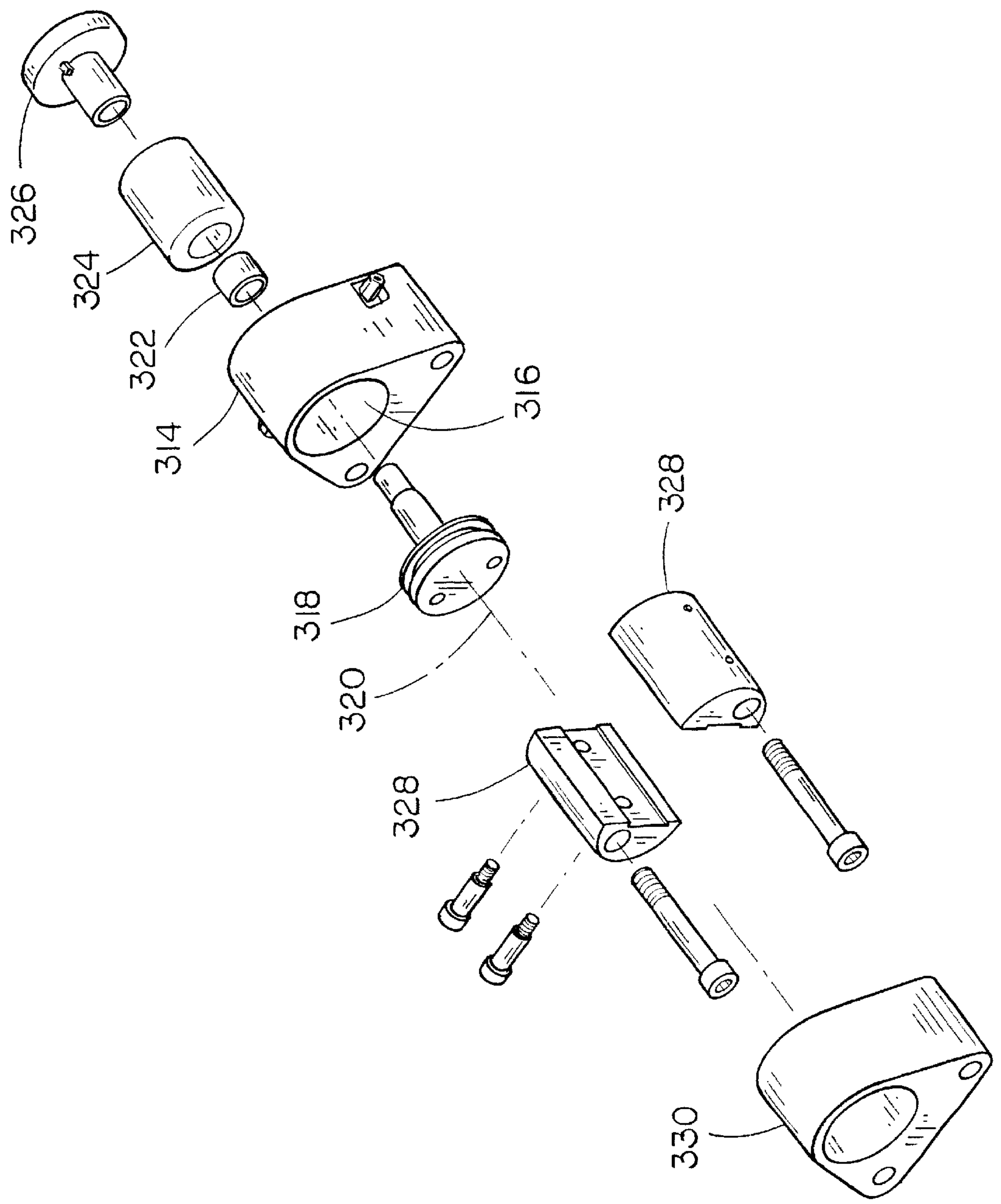
FIG. 7 is an exploded view of the press subassembly.

The infeed assembly 100 and the selector assembly 200 may be implemented to move individual electrical terminals 20 to the loader assembly 400. Preferably, however, the infeed assembly 100 and the selector assembly 200 are designed to move the integrated electrical terminals 18 toward the press assembly 300. The press assembly 300 shown in FIGS. 6–8 includes a press frame 302 mounted on a device mount 700. The press frame 302 has mounted to it a frame brace 304, an upper press mount 306, a lower press mount 308, and a die 310. The upper press mount 306 and the lower press mount 308 are adapted to support a press subassembly 312.

The press subassembly 312 includes a housing 314. The housing 314 has an aperture 316 in which a piston 318 is located. The piston 318 has an axis 320 and can move along the axis 320 within the housing 314. The piston 318 also has a shaft 322 that extends through a spring 324 to a hydraulic cylinder 326. The hydraulic cylinder 326 is adapted to drive the piston 318 along the axis 320 away from a starting position and the hydraulic cylinder 326. The spring 324 is adapted to draw the piston 318 back toward the hydraulic cylinder 326 to the starting position. The piston 318 has mounted to it punch holder blocks 328. The punch holder blocks 328 are housed within spring housing 330 and are adapted to retain a punch 332 therebetween. When the press subassembly 312 is actuated, the punch 332 is driven by the hydraulic cylinder 326 along the axis 320 from a place of origin. The spring 324 then returns the punch to the place of origin. The punch 332 is adapted to fit into an opening 334 in the die 310.

The frame brace 304 supports an air/oil hydraulic intensifier 336. The intensifier 336 is connected to the hydraulic cylinder 326 by a hose (not shown). The intensifier 336 provides sufficient force on the hydraulic cylinder 326 to drive the punch 332 through the material from which the integrated electrical terminals 18 are made and into the die 310, removing carrier portion 22 and producing a separated terminal 20.

Figure 11:
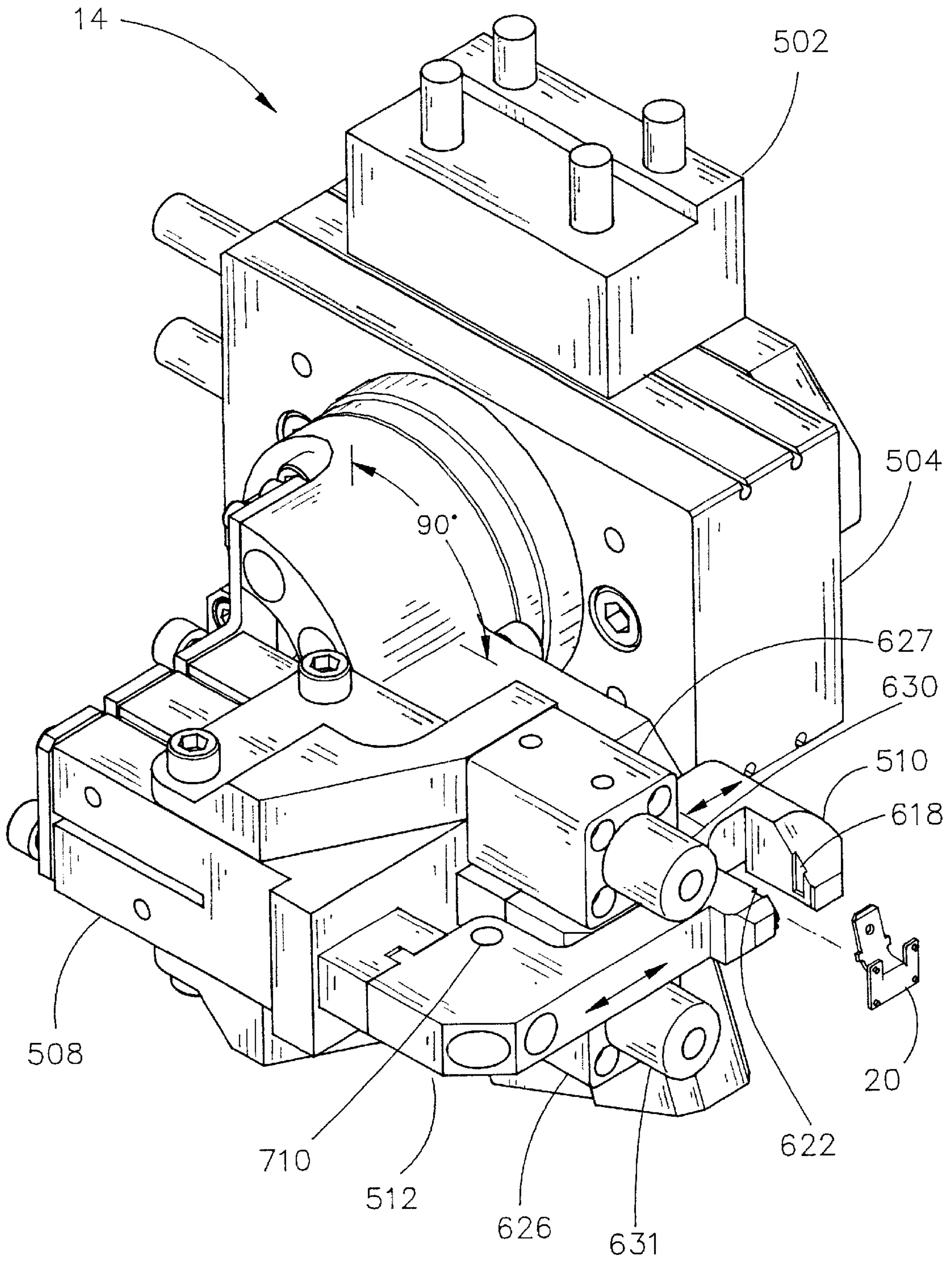
FIG. 11 is an isometric view of the soldering and test assembly.
Figure 12:
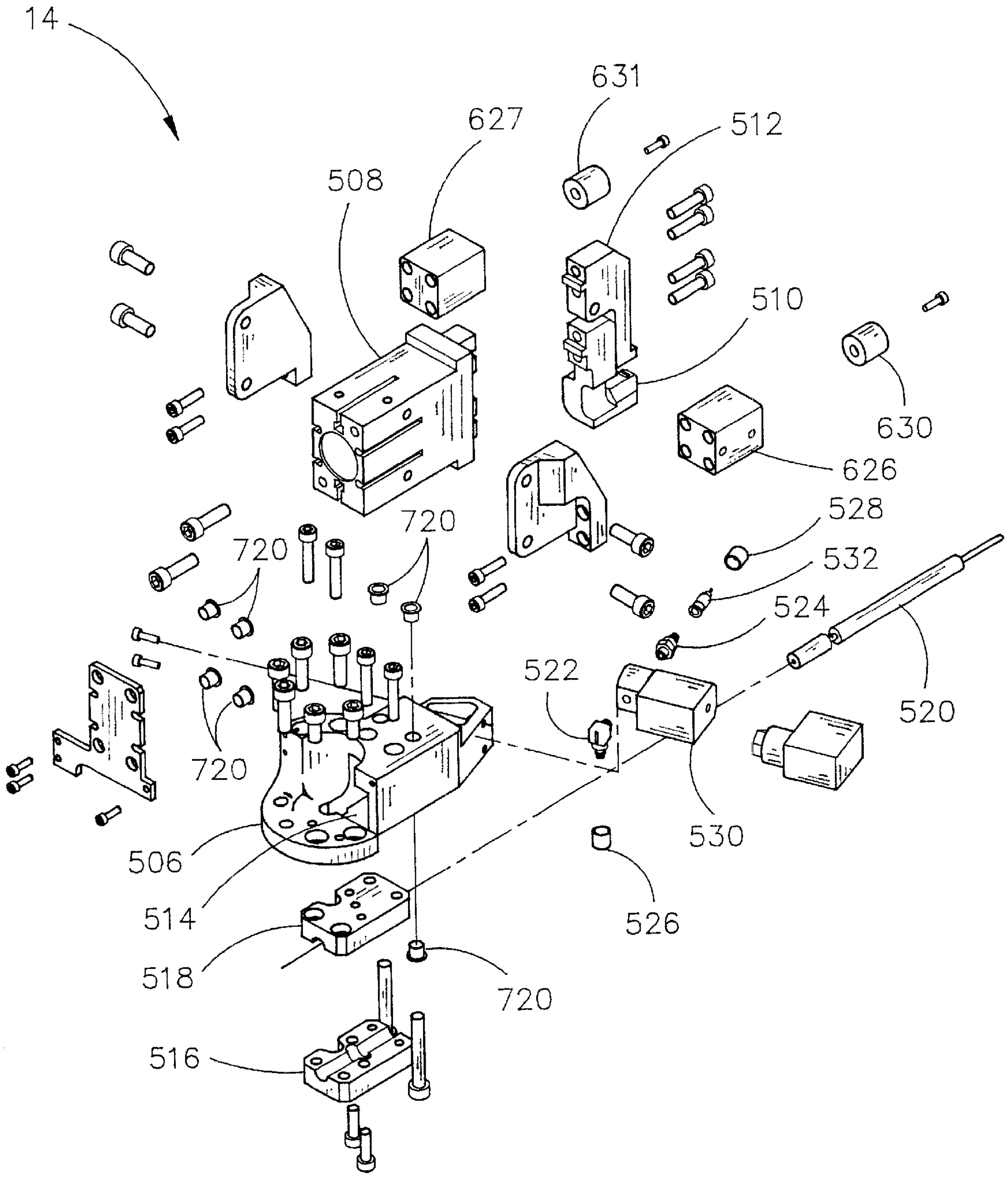
FIG. 12 is an exploded view of the soldering and test assembly.
Figure 13:
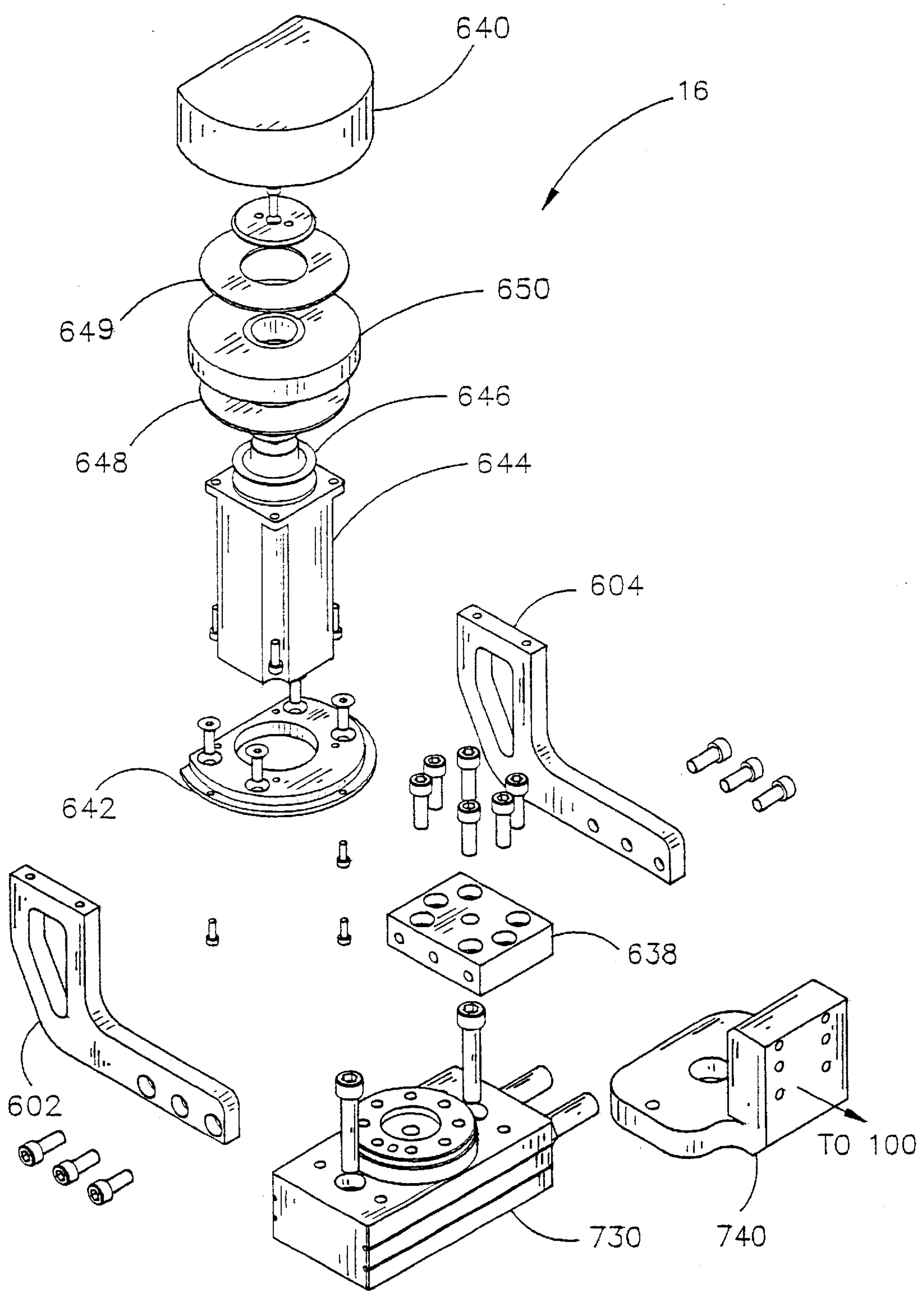
FIG. 13 is an exploded view of the burnishing assembly.

The device 10 includes a loader assembly 400 for the handling of a separated terminal 20. The loader assembly 400 includes a loader mount 402. The loader mount 402 is connected on one end to the infeed mount 102 and, on its other end, has mounted to it a loader bracket 404 and a loading air cylinder 406. The loader bracket 404 has mounted to it loader bearing rails 408. The loading air cylinder 406 is adapted to movably receive a gripper mount 410 such that the gripper mount 410 may move toward or away from the loader mount 402. The gripper mount 410 has attached to it loader bearing blocks 412 and an air actuated gripper 414. The loader bearing blocks 412 are adapted to slidably receive the loader bearing rails 408. The air-actuated gripper 414 includes opposing left and right arms 416 and 418, respectively. Opposing left and right arms 416 and 418 each have connected to it a gripper jaw 420 and 421, respectively. As can be seen in FIG. 11, opposing left and right arms 416 and 418 may be configured in an open position. The air-actuated gripper 414 draws the opposing left and right arms 416 and 418 toward each other so that the gripper jaws 420 and 422 are drawn toward each other. The gripper jaws 420 and 422 are adapted to hold a terminal 20.

Figure 8:
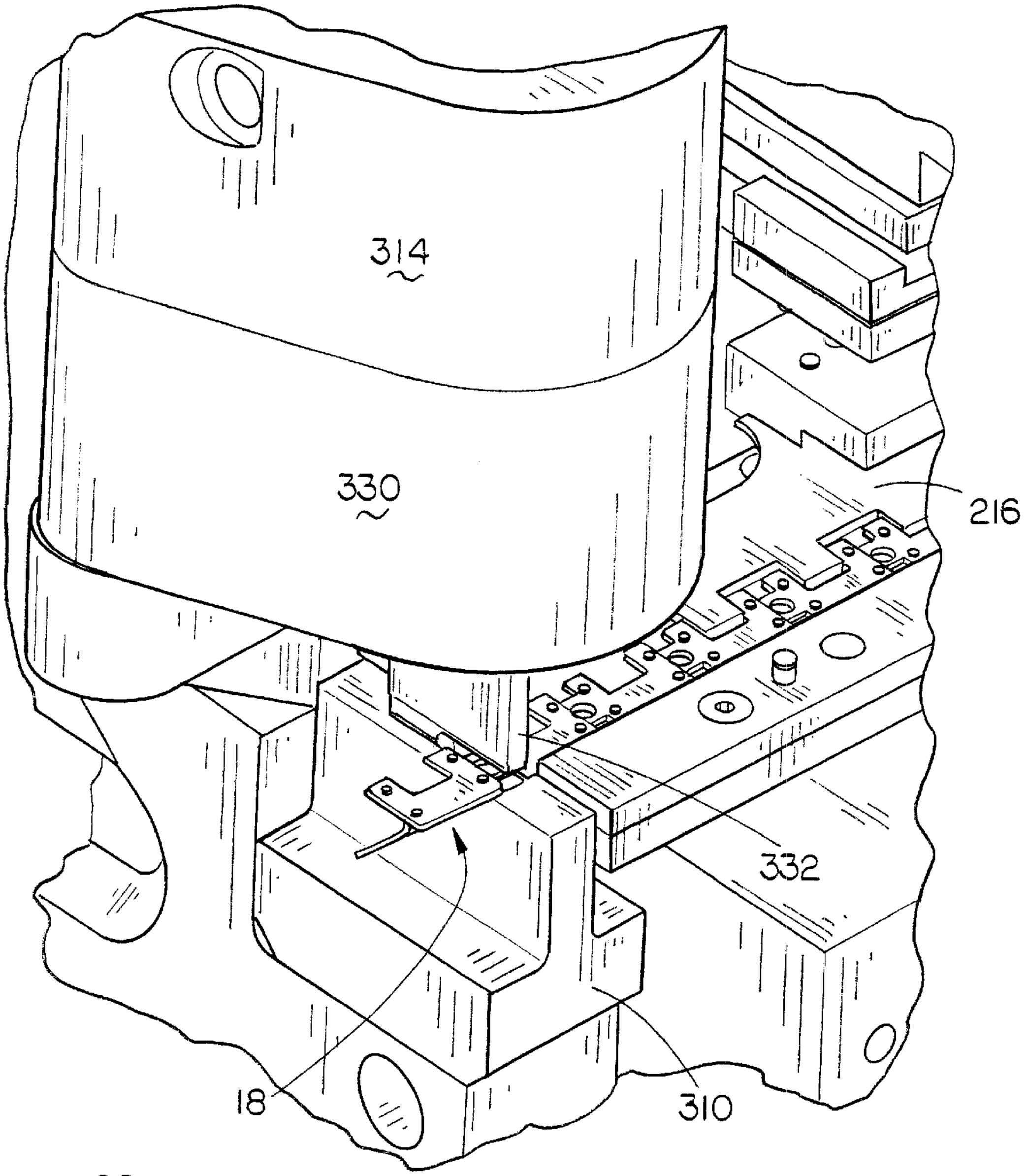
FIG. 8 is an isometric view of the press assembly in relation to the integrated workpieces.
Figure 9:
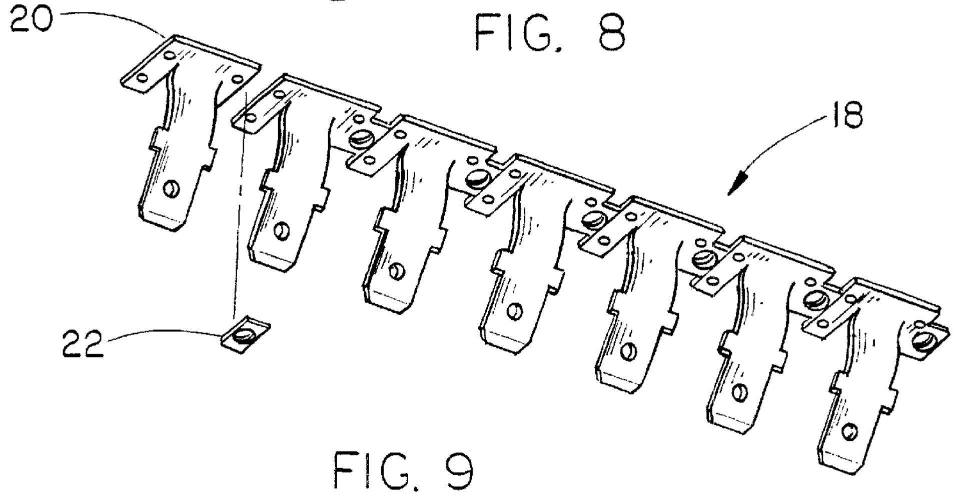
FIG. 9 is an isometric view of the integrated workpieces.

In operation, the loading air cylinder 406 maintains the gripper mount 410 in a starting position away from the loader mount 402. In the starting position, the opposing left and right arms 416 and 418 are in an open position. The air actuated gripper 414 then draws the opposing left and right arms 416 and 418 toward each other so that the gripper jaws 420 and 422 grip terminal 20 at the end of the integrated electrical terminals 18. The terminal 20 being held by the gripper jaws 420 and 422 is positioned on the downstream side of the die 310. The terminal carrier portion 22 connecting the individual terminal 20 to the remainder of the integrated electrical terminals 18 is positioned directly over the opening 334 of the die 310 by the selector assembly 200 as is seen in FIG. 8. The punch 332 is driven into the die 310, shearing the terminal carrier portion 22 from both the individual terminal 20 and the integrated electrical terminals 18. The gripper mount 410 is then drawn toward the loader mount 402 by the loading air cylinder 406, thereby placing the severed terminal 20 in its point of use, or, alternatively, loading the terminal 20 into a separate apparatus for positioning the terminal 20.

As seen in FIGS. 2, 11, 12, and 15, the disclosed device includes a soldering assembly 14. The soldering assembly 14 includes a rotator mount 502, which is mounted on the infeed mount 102. An air-actuated rotator 504 is mounted on the rotator mount 502 and has a positioner mount 506 mounted thereon that may be rotated clockwise and counterclockwise with respect to the rotator mount 502. A parallel gripper 508 is mounted on the positioner mount 506 and has attached to it first and second parallel jaws 510 and 512. The parallel gripper 508 is capable of moving the first and second parallel jaws 510 and 512 toward or away from each other. The first and second jaws 510 and 512 are adapted to grab, hold, and release a terminal 20. In the soldering assembly shown in the drawings, the soldering mechanism is an intermittent microflame soldering tool, although it is contemplated that any soldering tool could be employed in the device. In the soldering assembly 14 that is shown, the positioner mount 506 has a cavity 514 therein adapted to receive an electrode base 516 and electrode clamp 518. An electrode 520 is retained between the electrode base 516 and the electrode clamp 518 so that the terminal 20 extends entirely through the cavity 514 to protrude on the opposite side of positioner mount 506. The intermittent microflame soldering tool shown includes fittings 522 and 524, fitting retainers 526 and 528, valve 530, and burner tip 532. The positioner mount 506 may be modified to accept any appropriate soldering mechanism.

Figure 14A:
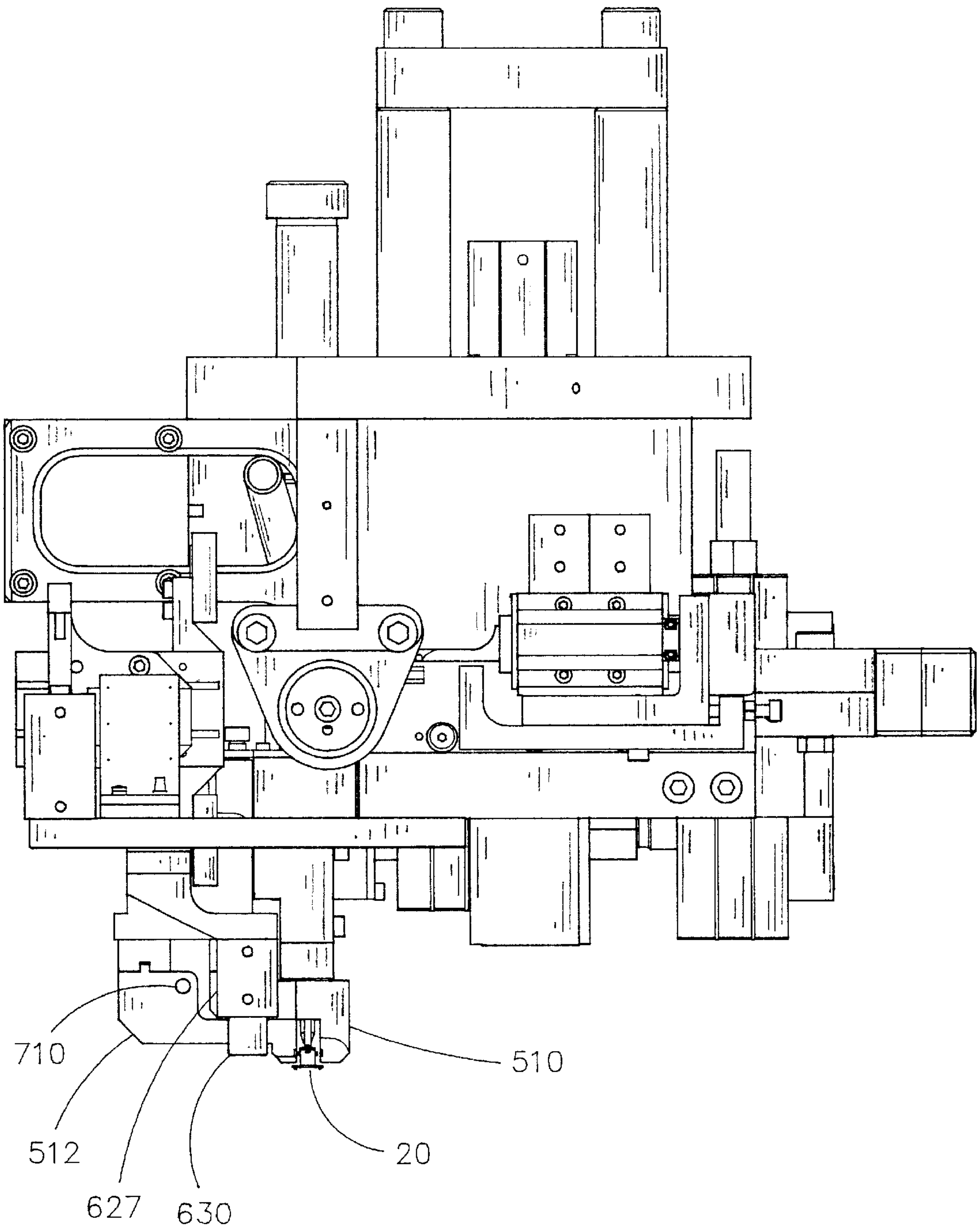
FIG. 14A is a front elevational view of the device, depicting the manner in which the subject component is positioned relative to the soldering and pull test assembly.

In operation, the first and second parallel jaws 510 and 512 are drawn toward each other by the parallel gripper 508 to grasp an individual terminal 20 from the left and right gripper jaws 420 and 422 of the loader assembly 400. The air actuated rotator 504 then rotates the positioner mount 506 so that the first and second parallel jaws 510 and 512 hold the terminal 20 at its point of use, as shown in FIG. 14A. The solder that is integrated with the terminal 20 is then heated by the soldering tool to connect the terminal 20 to the subject component. Preferably, the terminal is fed into the device 10 having not only solder integrated therewith, but also having flux coating applied thereto. The device 10 may also include a conventional apparatus for applying a soldering related material such as a flux coating apparatus (not shown) or a conventional solder paste application apparatus (not shown). The flux coating apparatus or solder paste application apparatus will, preferably, apply materials to the terminal 20 immediately prior to the implementation of the terminal 20.

A number of additional functions may be incorporated into the device 10. Among the possible accessories are those shown in FIG. 2. For example, terminal application device 10 includes a pull test and electrical test described as follows. The pull test operation utilizes the parallel gripper 508. The gripper 508 has movable, opposing arms 510 and 512, respectively, and is adapted to draw the opposing arms 510 and 512 toward and away from each other. Opposing arm 510 has a feature 618 in its gripper that secures terminal 20. Opposing arm 512 has a similar feature 622 in its gripper that secures terminal 20. A pair of air push rod cylinders 626 and 627 are mounted to the underside of the gripper 508. The pair of air push rod cylinders 626 and 627 include push rods 628 and 629 which has pads 630 and 631 attached to its end.

In operation, the gripper 508 draws the opposing gripper arms 510 and 512 toward each other so that the gripper jaw features 618 and 622 engage a connected electrical terminal 20. The air push rod cylinders 626 and 627 are activated so that the pads 630 and 631 at the end of the push rods 628 and 629 contact the subject component to lift the device 10 away from the subject component. The movement of the device 10 away from the subject component is restricted by the connection of the electrical terminal 20 to the subject component. If the connection between the terminal 20 and the subject component is strong enough, the device 10 will not move. If, on the other hand, the connection is weak, the force exerted by the air push rod cylinders 626 and 627 will disconnect the electrical terminal 20 from the subject component.

The pull test operation may also include an electrical connection tester. The electrical connection tester is, preferably, employed in an environment where two of the devices 10 are employed to simultaneously implement electrical terminals 20 in a single circuit. The opposing gripper arms 510 and 512 of each device 10 may be supplied with electrical connections that contact each subject terminal 20 when opposing gripper arms 510 and 512 are drawn toward each other. Each of the respective terminal grippers 508 are electrically isolated from the positioner mounts 506 via eight insulating bushings 720.

One of the devices 10 may be adapted to provide an electrical charge that travels through the subject component to the terminal 20 that is in contact with the other of the devices 10, via an electrical connection 710 being attached to gripper jaw 512. The other of the devices 10 may be identically equipped with a sensor to determine whether the electrical charge has traveled from one of the subject terminals, through the circuit in the subject component to the other of the subject terminals, indicating a proper electrical connection.

The burnishing accessory 16 includes a buffer mount 638. The buffer mount 638 is attached to the infeed assembly 100. A buffer housing 640 is mounted to the buffer motor mount 642. A motor mount 642 is mounted to the buffer housing 640 so that the buffer mount 638, buffer housing 640 and motor mount 642 define a rotatable assembly. The buffer mount 638 is mounted onto a buffer rotary actuator 730 which is secured by the buffer rotary actuator mount 740 which is attached to the infeed assembly 100. An electric motor 644 is mounted on the motor mount 642. A burnishing wheel adapter 646 is operatively connected to the motor 644 and is housed into the chamber formed by the buffer housing 640 and the motor mount 642. The burnishing wheel 650 is adapted to engage outer and inner wheel flanges 648 and 649, respectively. Accordingly, the outer and inner wheel flanges 648 and 649 hold an burnishing wheel 650 there between. Rotation of the motor 644 results in the rotation of the burnishing wheel 650. The buffer housing 640 may also have a dust hose attached to it (not shown). The dust hose may be connected to a vacuum device (not shown) to assist in the removal of dust created by the burnishing wheel 650.

Figure 14B:
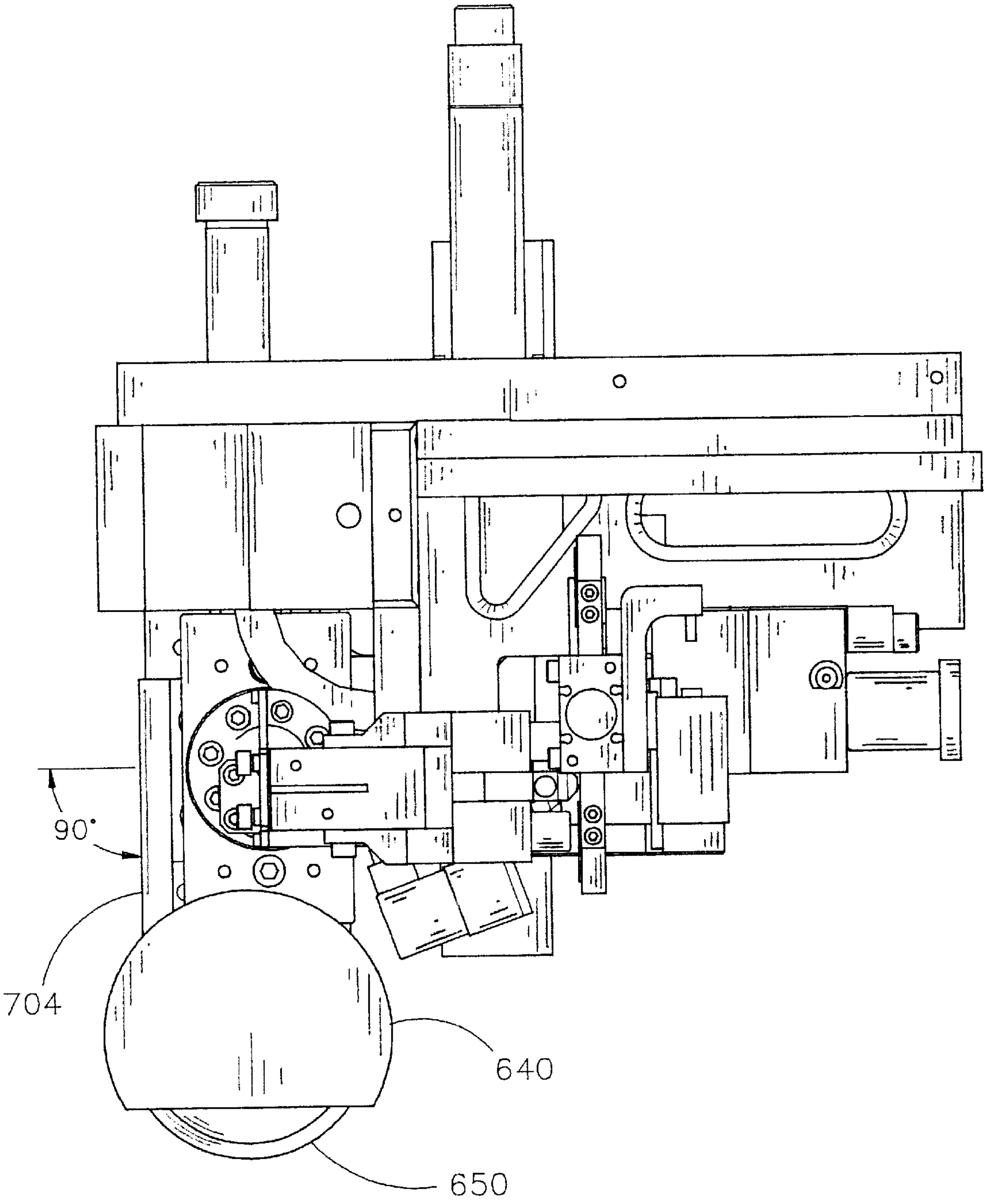
FIG. 14B is a side elevational view of the device and details the manner in which the burnish tool is positioned relative to the subject component.
Figure 14C:
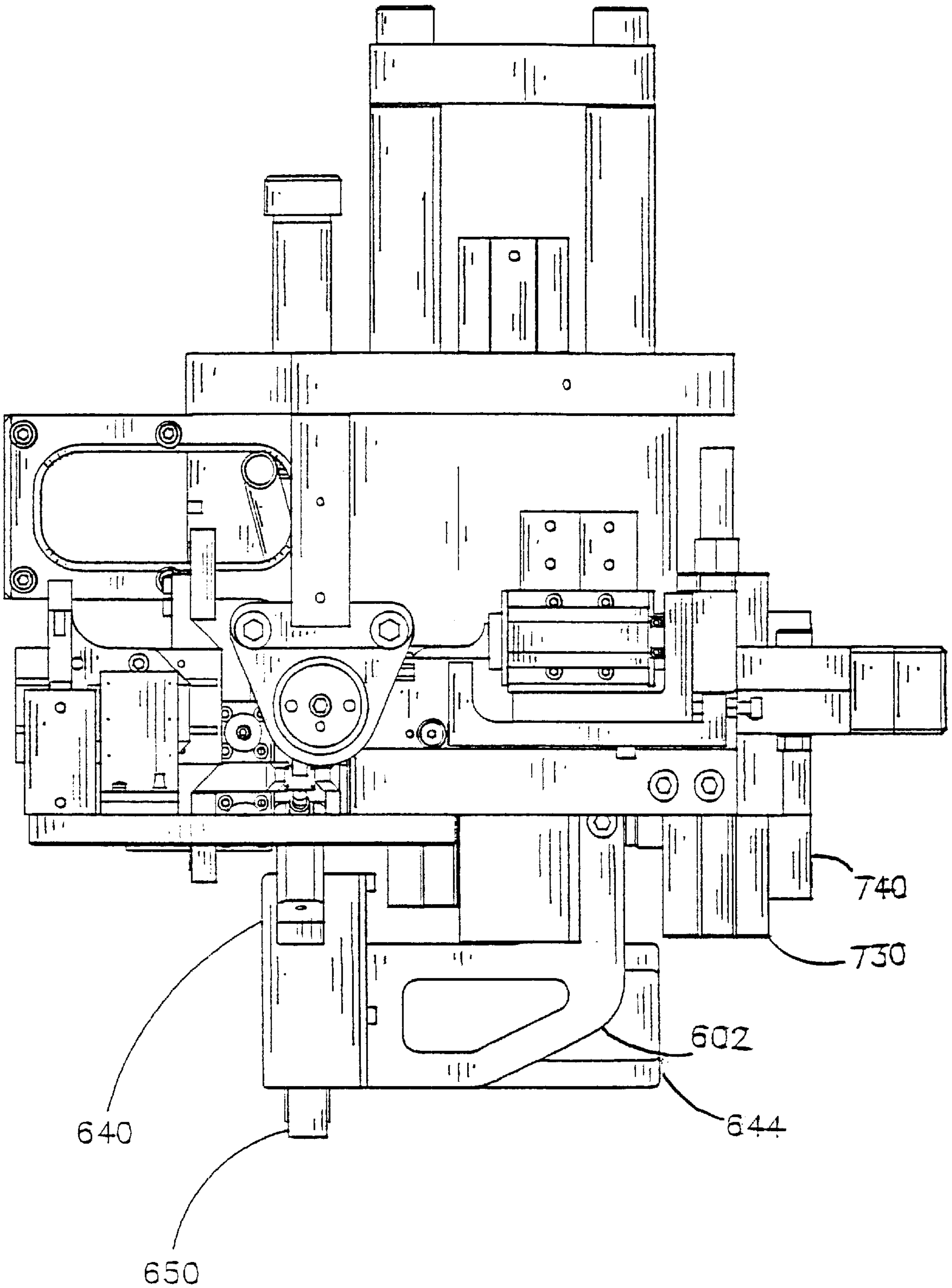
FIG. 14C is a front elevational view of the device and details the manner in which the subject component is positioned relative to the burnishing wheel.
Figure 15:
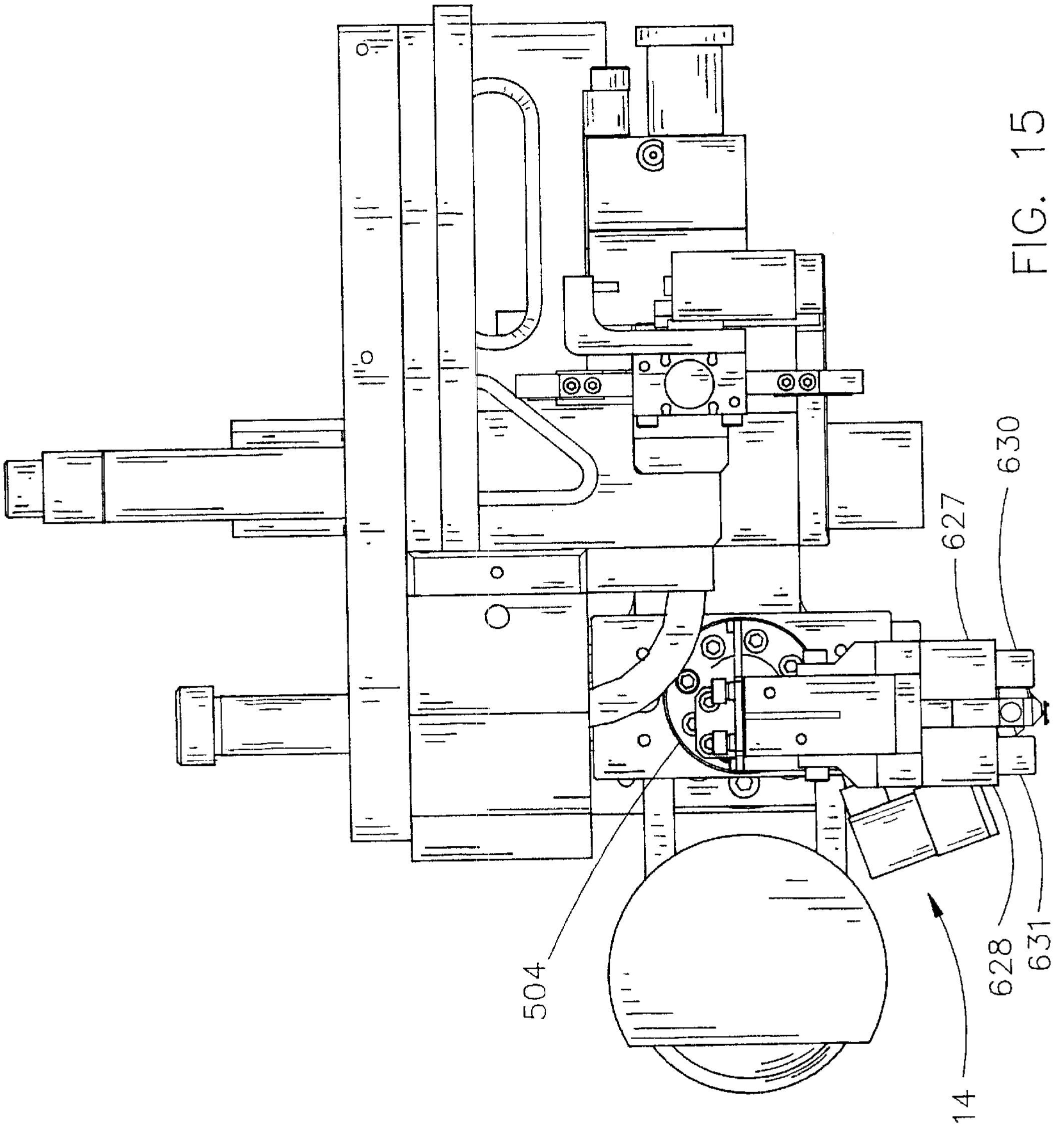
FIG. 15 is a side elevational view of the soldering assembly and pull test assembly and details the manner in which the soldering assembly and pull test assembly are positioned against the subject component.

In operation, the subject component will be placed under the terminal implementation device 10 prior to the connection of the individual electrical terminal 20 thereto, as shown in FIG. 14B. The burnishing wheel 650 will prepare the surface of the subject component for connection of the individual electrical terminal 20. This will be accomplished by the rotation of the burnish rotary actuator 730 which will position the burnishing wheel 650 below the terminal implementation tool 10 at the location where the solder tool 14 will attach the terminal 20 to the subject component. Then the burnish operation will be performed by the rotation of the burnishing wheel 650 by the electric motor 644. Dust generated by the contact between the abrasive wheel 650 and the surface of the subject component will be removed from the surface through the dust hose.

As can be seen from the drawings, the operational positions of the burnishing accessory 16 and the pull test-soldering assembly 14 are the same. The device 10, therefore, does not have to be moved with respect to the subject component by either air cylinders (not shown) or by activation of a robot (not shown) for the implementation tool 10 to the burnish, solder, and test operations.

The accessories need not be positioned on a separate accessory assembly 16 as shown, but may be incorporated into other structures on the tool. As an example, it is contemplated that the air-actuated rotator 504 could be adapted to rotate burnish mount 638 to any one of three positions. In the first position, the first and second parallel jaws 510 and 512 could be positioned to receive the terminal 20 from the loader assembly 400. In the second position, the burnishing assembly 16 could be positioned to burnish the subject component. In the third position, the terminal 20 could be positioned at its point of use having, the integral solder and pull test assembly 14 could be positioned to determine the mechanical strength and electrical performance of the connection. Obviously, other permutations of the structure could exist, and the above descriptions are not intended to limit the scope of the structure to only the described structures.

Additional conventional accessories are contemplated by this disclosure, such as a vision camera. The accessories shown are merely exemplary and do not constitute an exhaustive list of the possible structures contemplated.

The device 10 as shown is adapted to be mounted on a positioning arm (not shown). Toward this end, the device 10 includes a device mount 700. A device attachment means 702 is mounted on the device mount 700. The device attachment means 702 is attached to the positioning arm and allows the positioning arm to locate the device 10 as necessary.

The device 10 also includes a vertical actuator 704. The vertical actuator 704 is attached to the press assembly 300 and the device mount 700. The vertical actuator 704 has at least one air actuated cylinder 706 that is connected to at least one of the infeed assembly 100, the selector assembly 200, the loader assembly 400, the soldering assembly 14 or the accessory assembly 16, but, preferably to the infeed mount 102. The air-actuated cylinder 706 is adapted to move the infeed assembly 100, the selector assembly 200, the loader assembly 400, the soldering assembly 14 and the accessory assembly 16 toward and away from the subject component. This movement allows the assemblies that must contact the subject component to do so and also allows the subject component to be moved relative to the device 10 without interference, as shown in FIGS. 14A, 14B, 14C, and 15. The movement also allows for the movement of integrated electrical terminals 18 having a flange without interference between the flange and the die 310, as shown in FIG. 8.

The integrated electrical terminals 18 are attached to the subject components sequentially, allowing for tracing of production lots and allowing for greater quality control. Furthermore, in instances where flux is applied to the integrated electrical terminals 18 prior to introduction into the device 10, the flux is not removed from the terminal by bulk shipping or production machinery. The quality of the connection between the terminal and the subject component is thereby enhanced.

In the drawings and in the specification, there has been set forth preferred embodiments of the invention and although specific items are employed, these are used in a generic and descriptive sense only and not for purposes of limitation. Changes in the form and proportion of parts, as well as a substitution of equivalents, are contemplated and circumstances may suggest or render expedient without departing from the spirit or scope of the invention as further defined in the following claims.

Thus it can be seen that the invention achieves at least all of the stated objectives.

I claim:

1. A reconfigurable device for soldering workpieces to an adjacent component having a point of use thereon, comprising:

a frame member;

positioning and testing means operatively connected to said frame member for placing at least one of the workpieces closely adjacent the point of use on the component and for testing a soldered connection; and attaching means operatively connected to said frame member for soldering said at least one of the workpieces to the point of use, after the at least one of the workpieces is placed by said positioning means, without relocating or repositioning the component or the device.

2. The device of claim 1 wherein said workpieces are integrated prior to said positioning means placing said at least one of the workpieces closely adjacent the point of use.

3. The device of claim 2 further comprising feeding means operatively connected to said frame member for moving the integrated workpieces on a path through the device.

4. The device of claim 3 further comprising a separating tool operatively connected to said frame member adjacent said feeding means for separating the integrated workpieces.

5. The device of claim 1 further comprising a burnishing tool operatively connected to said frame member adjacent said attaching means for cleaning the point of use on the component before said at least one of the workpieces is placed closely adjacent the point of use; said burnishing tool being operatively coupled with said positioning and testing means so that said positioning and testing means can place the at least one of the workpieces closely adjacent the point of use after said burnishing tool cleans the point of use, without relocating the component or the device.

6. The device of claim 1 wherein said positioning and testing means is adapted to test the solder connection between said at least one of the workpieces and the component after said at least one of the workpieces is soldered to said point of use without first repositioning the component or the device.

7. The device of claim 6 wherein said positioning and testing means is comprised of means for testing the electrical connection between said at least one of the workpieces and the component.

8. The device of claim 6 wherein said positioning and testing means is comprised of means for testing the strength of the mechanical connection between said at least one of the workpieces and the component.

9. The device of claim 1 further comprising means operatively connected to said frame member for selectively moving said device with respect to the component.

10. A method for operatively connecting at least one workpiece to a component having a point of use thereon comprising the steps of:

providing at least one reconfigurable workpiece implementation device having a frame member; a positioning and testing means operatively connected to said frame member for placing the at least one workpiece closely adjacent the point of use and for testing a soldered connection; and attaching means operatively connected to said frame member for soldering the at least one workpiece to the point of use, after the at least one of the workpieces is placed by said positioning means, without relocating or repositioning the device;

positioning the component adjacent to said workpiece implementation device;

operating said positioning and testing means to place the at least one workpiece closely adjacent the point of use on the component; and operating said attaching means to solder the at least one workpiece to the point of use after the at least one workpiece is placed closely adjacent the point of use with the positioning and testing means without the necessity of first relocating or repositioning the component or the workpiece implementation device.

11. The method of claim 10 further comprising the steps of providing said workpiece implementation device with a burnishing tool and cleaning the point of use with said burnishing tool after said component is positioned adjacent said implementation device; said positioning and testing means then performing the step of placing the at least one workpiece closely adjacent the point of use without relocating the component or the workpiece implementation device.

12. The method of claim 10 further comprising the step of testing the mechanical strength of the connection between the at least one workpiece and the point of use using said positioning and testing means, after the at least one workpiece is soldered to the point of use, without relocating or repositioning the component or the workpiece implementation device.

13. The method of claim 10 further comprising the step of testing the electrical connection between the at least one workpiece and the component with said positioning and testing means, after the at least one workpiece is soldered to the point of use, without relocating or repositioning the component or the workpiece implementation device.

* * * * *

UNITED STATES PATENT AND TRADEMARK OFFICE

CERTIFICATE OF CORRECTION

PATENT NO. : 6,584,670 B2
DATED : July 1, 2003
INVENTOR(S) : Larry J. Costa

It is certified that error appears in the above-identified patent and that said Letters Patent is hereby corrected as shown below:

Title page,
Item [54], title should be -- WORKPIECE IMPLEMENTATION DEVICE -- instead of "ELECTRICAL TERMINAL IMPLEMENTATION DEVICE."

Column 2,
Line 50 "Postponer" should be -- positioner. --

Figure 10:
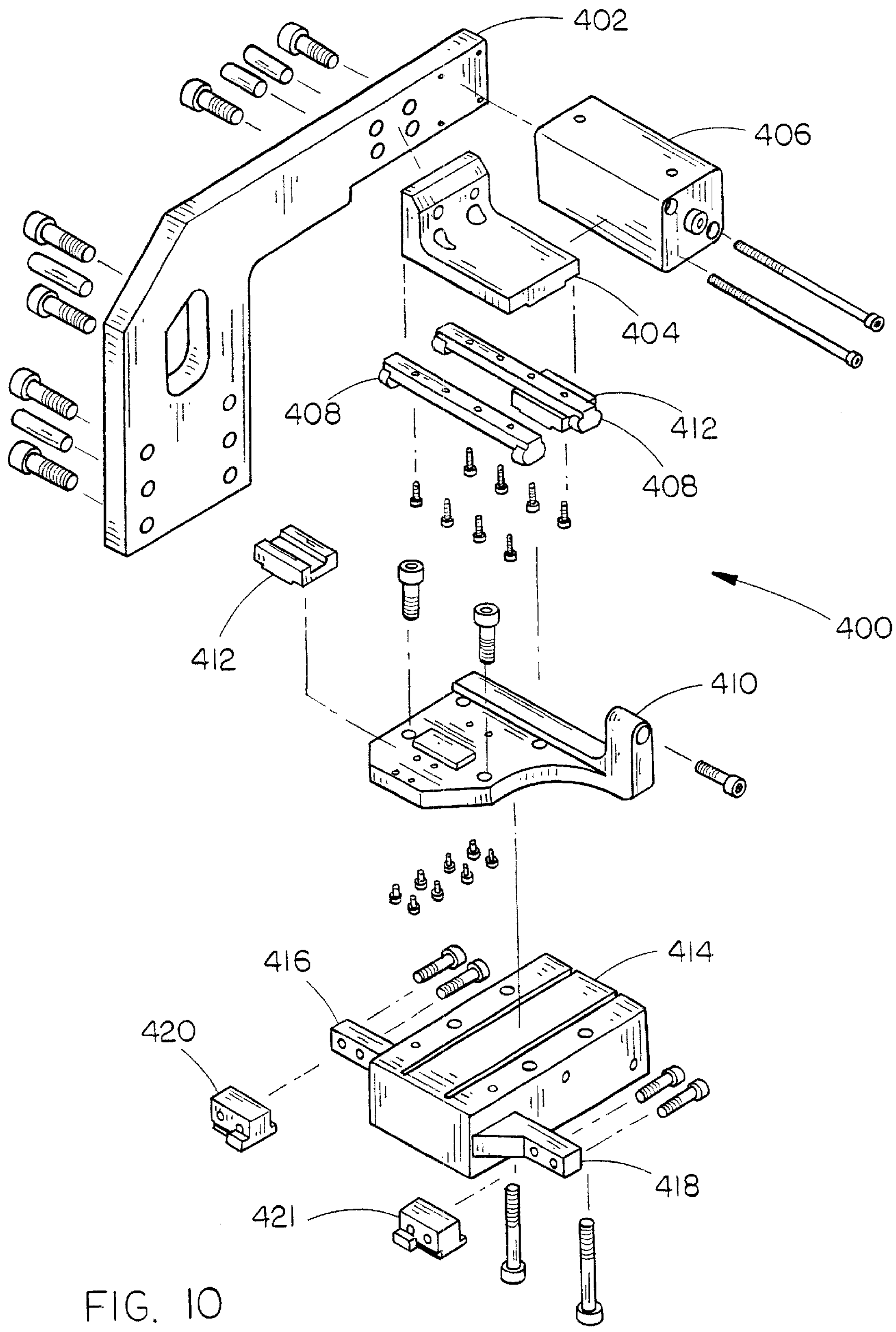
FIG. 10 is an exploded view of the loader assembly.

Column 6,
Line 2, "FIG. 11" should be -- FIG. 10. --

Signed and Sealed this

Seventh Day of October, 2003

JAMES E. ROGAN
*Director of the United States Patent and Trademark Office*